United States Patent
Morishita et al.

(10) Patent No.: US 11,605,419 B2
(45) Date of Patent: Mar. 14, 2023

(54) SEMICONDUCTOR DEVICE HAVING A TEST CIRCUIT

(71) Applicant: Micron Technology, Inc., Boise, ID (US)

(72) Inventors: Satoshi Morishita, Yokohama (JP); Yoshifumi Mochida, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/364,829

(22) Filed: Jun. 30, 2021

(65) Prior Publication Data

US 2023/0005520 A1    Jan. 5, 2023

(51) Int. Cl.
*G11C 7/00* (2006.01)
*G11C 11/408* (2006.01)
*G11C 29/12* (2006.01)
*G11C 11/4091* (2006.01)

(52) U.S. Cl.
CPC ...... *G11C 11/4087* (2013.01); *G11C 11/4085* (2013.01); *G11C 11/4091* (2013.01); *G11C 29/12* (2013.01); *G11C 2029/1202* (2013.01)

(58) Field of Classification Search
CPC ............ G11C 11/4087; G11C 11/4085; G11C 11/4091; G11C 29/12; G11C 2029/1202
USPC ........................................................ 365/201
See application file for complete search history.

(56) References Cited

U.S. PATENT DOCUMENTS

| | | | | |
|---|---|---|---|---|
| 5,424,940 A | * | 6/1995 | Ousborne | G07F 9/105 68/12.02 |
| 7,626,875 B2 | * | 12/2009 | Han | G11C 29/18 365/201 |
| 7,903,484 B2 | * | 3/2011 | Nakamura | G11C 29/806 365/201 |
| 8,023,353 B2 | * | 9/2011 | Nakashima | G11C 29/50 365/194 |
| 9,595,351 B2 | * | 3/2017 | Choi | G11C 29/18 |
| 2008/0279021 A1 | * | 11/2008 | Han | G11C 29/18 365/201 |

* cited by examiner

*Primary Examiner* — Viet Q Nguyen
(74) *Attorney, Agent, or Firm* — Dorsey & Whitney LLP

(57) ABSTRACT

Disclosed herein is an apparatus that includes a plurality of memory sections each including a plurality of word lines, a predecoder circuit configured to generate predecoded section address signals to select one of the plurality of memory sections and predecoded word line address signals to select one of the word lines included in a selected one of the plurality of memory sections based on a row address, and a section address control circuit configured to retain the predecoded section address signals regardless of an update of the row address in a test operation mode.

12 Claims, 5 Drawing Sheets

SEMICONDUCTOR DEVICE HAVING A TEST CIRCUIT

BACKGROUND

In a semiconductor memory device such as a DRAM, there is a case where word lines are tested in a manufacturing stage. For example, a test may be conducted to evaluate whether data of memory cells is correctly inverted by selecting a word line only for a short time in a state where a sense amplifier is activated. In such a test, it is necessary to keep the active state of the sense amplifier even when the selected word line is changed by change of a row address. However, selection firm a group of sense amplifiers is performed based on higher-order bits of the row address and therefore, when a hazard occurs in the higher-order bits of the row address because of change of the row address, the sense amplifier is made temporarily inactive and the word line test cannot be conducted correctly.

DETAILED DESCRIPTION

Various embodiments of the present disclosure will be explained below in detail with reference to the accompanying drawings. The following detailed description refers to the accompanying drawings that show, by way of illustration, specific aspects, and embodiments in which the present disclosure may be practiced. These embodiments are described in sufficient detail to enable those skilled in the art to practice the present disclosure. Other embodiments may be utilized, and structural, logical, and electrical changes may be made without departing from the scope of the present disclosure. The various embodiments disclosed herein are not necessary mutually exclusive, as some disclosed embodiments can be combined with one or more other disclosed embodiments to form new embodiments.

Figure 1:
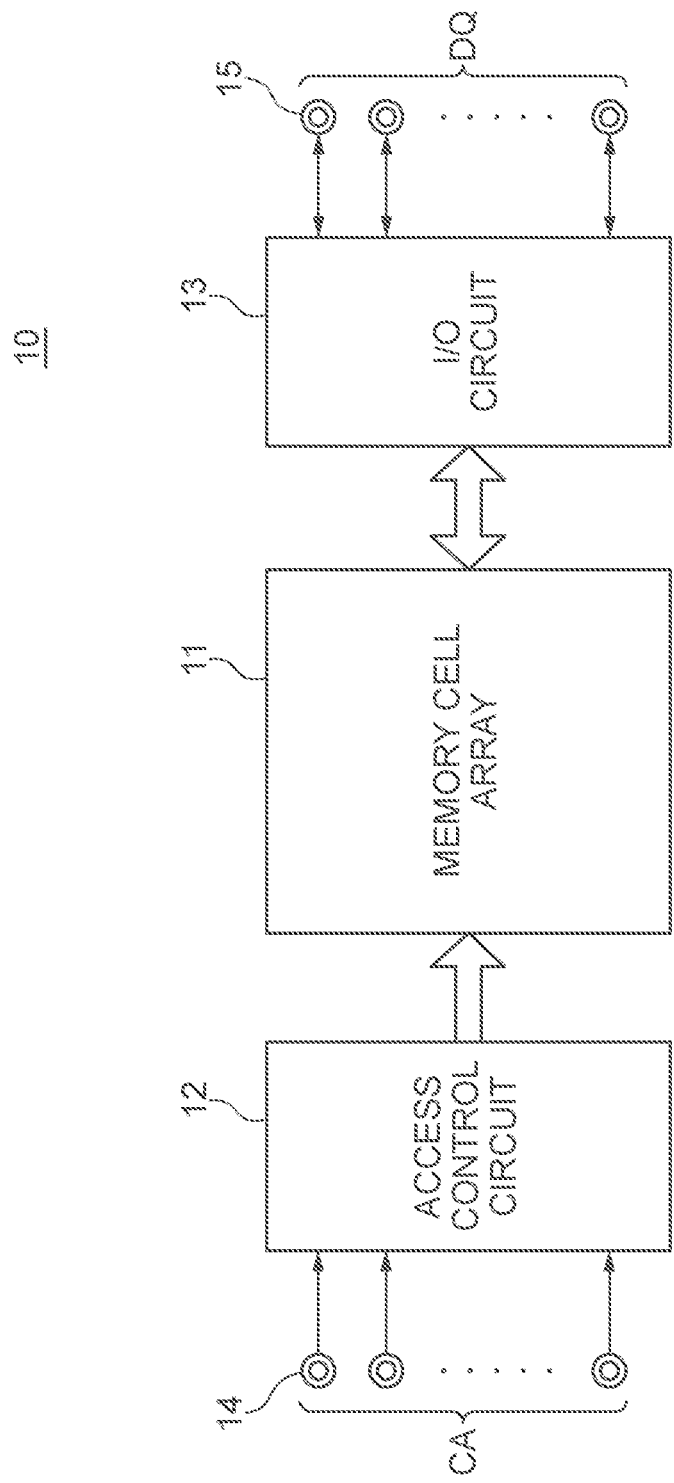
FIG. 1 is a block diagram showing a configuration of a semiconductor device according to an embodiment of the present disclosure.

FIG. 1 is a block diagram showing a configuration of a semiconductor device 10 according to the present disclosure. The semiconductor device 10 shown in FIG. 1 is, for example, a DRAM and includes a memory cell array 11, an access control circuit 12 that accesses the memory cell array 11, and an I/O circuit 13 that inputs and outputs data to/from the memory cell array 11. The access control circuit 12 accesses the memory cell array 11 based on a command address signal CA input from an external controller via command address terminals 14. In a read operation, data DQ read out from the memory cell array 11 is output to data terminals 15 via the I/O circuit 13. In a write operation, data DQ input to the data terminals 15 from an external controller is written to the memory cell array 11 via the I/O circuit 13.

Figure 2A:
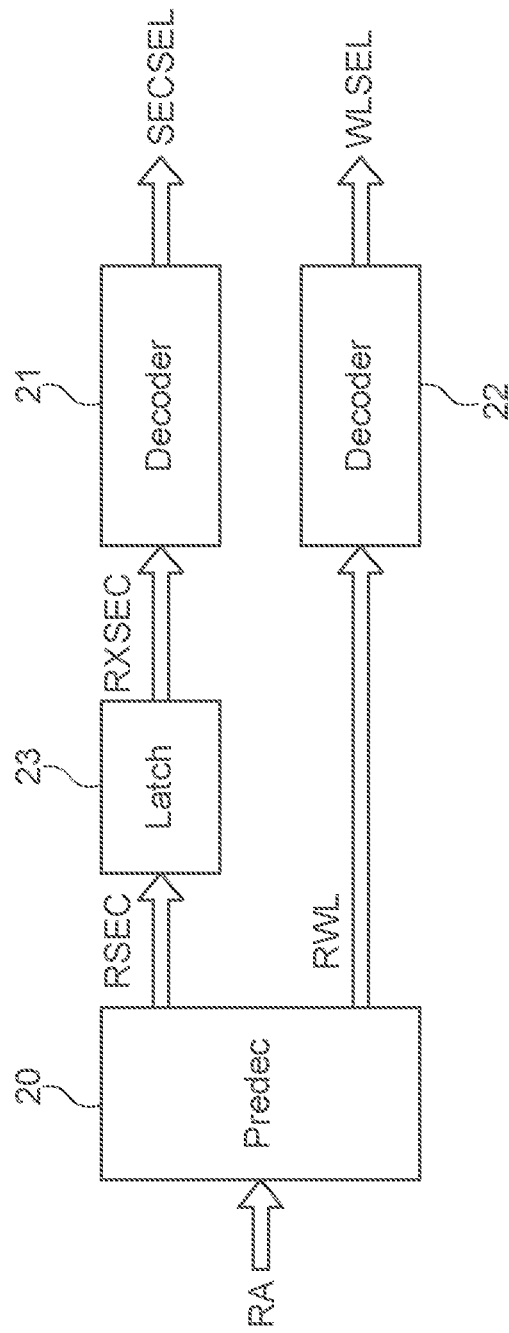
FIG. 2A is a block diagram showing a configuration of a row decoder included in an access control circuit according to an embodiment of the present disclosure.
Figure 2B:
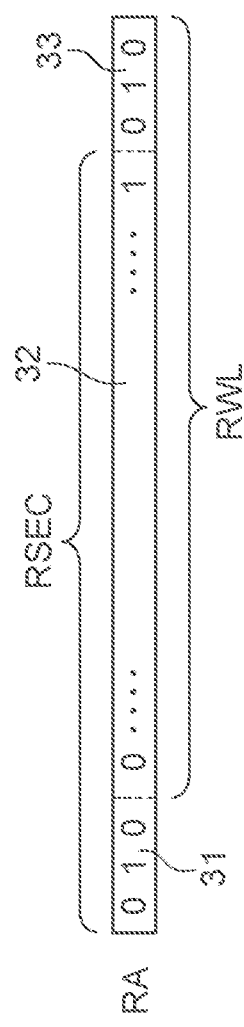
FIG. 2B is a schematic diagram for explaining a relation between a row address and a section address and a word line address according to an embodiment of the present disclosure.

FIG. 2A is a block diagram showing a configuration of a row decoder included in the access control circuit 12. As shown in FIG. 2A, the access control circuit 12 includes a predecoder circuit 20 that predecodes a row address RA to generate a section address RSEC and a word line address RWL, a latch circuit 23 that transmits the section address RSEC as is or latches it, thereby generating a section address RXSEC, a decoder circuit 21 that decodes the section address RXSEC to generate a section selection signal SECSEL, and a decoder circuit 22 that decodes the word line address RWL to generate a word line selection signal WLSEL. As shown in FIG. 2B, the row address RA is constituted by a first address portion 31 including higher-order bits, a second address portion 32, and a third address portion 33 including lower-order bits. The predecoder circuit 20 generates the section address RSEC based on the first address portion 31 and the second address portion 32, and generates the word line address RWL based on the second address portion 32 and the third address portion 33. In this manner, the second address portion 32 included in the row address RA is used for both generation of the section address RSEC and generation of the word line address RWL. Here, the section address RSEC and the word line address RWL do not overlap each other when the number of word lines included in each memory section can be represented by a power-of-2. However, the section address RSEC and the word line address RWL overlap each other as shown in FIG. 2B when the number of word lines included in each memory section cannot be represented by a power-of-2.

Figure 3:
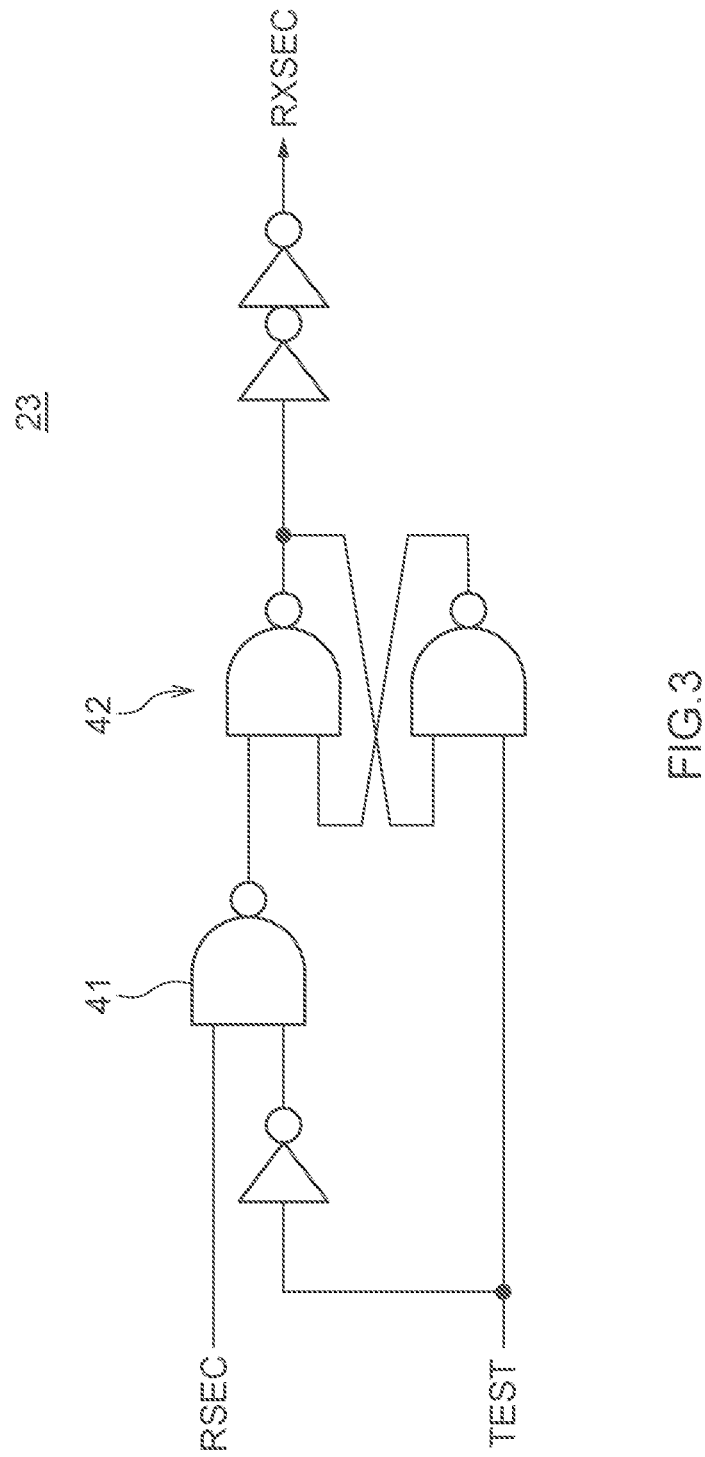
FIG. 3 is a circuit diagram of a latch circuit in an embodiment of the present disclosure.

FIG. 3 is a circuit diagram of the latch circuit 23. FIG. 3 shows a circuit for one bit of the section address RSEC among circuits constituting the latch circuit 23. Therefore, the latch circuit 23 actually includes the circuits shown in FIG. 3, the number of which is the same as the number of bits of the section address RSEC. As shown in FIG. 3, the latch circuit 23 includes a NAND gate circuit 41 that receives a predetermined bit of the section address RSEC and an inverted signal of a test signal TEST, and an SR flip-flop circuit 42 controlled by an output signal of the NAND gate circuit 41 and the test signal TEST. The test signal TEST is activated to a high level during a word line test operation. During a normal operation, the test signal TEST is maintained at a low level. Therefore, during the normal operation, the section address RSEC is transmitted as is and is output as the section address RXSEC. On the other hand, when the test signal TEST is changed from a low level to a high level, the current section address RSEC is latched by the SR flip-flop circuit 42, and the latched section address RSEC is output as the section address RXSEC. This state is maintained over a period of time during which the test signal TEST is at a high level. That is, during the period of time during which the test signal TEST is at a high level, the section address RXSEC input to the decoder circuit 21 is not changed even when the section address RSEC output from the predecoder circuit 20 is changed. Therefore, during the period of time during which the test signal TEST is at a high level, the section selection signal SECSEL output from the decoder circuit 21 is fixed even when the row address RA is changed. Meanwhile, such a latch circuit is not inserted between the predecoder circuit 20 and the decoder circuit 22 and therefore, when the word line address RWL output from the predecoder circuit 20 is changed during the period of time during which the test signal TEST is at a high level, the changed word line address RWL is input to the decoder circuit 22 as is. Accordingly, when the row address RA is changed, the word line selection signal WLSEL output from the decoder circuit 21 is also changed irrespective of the level of the test signal TEST.

Figure 4:
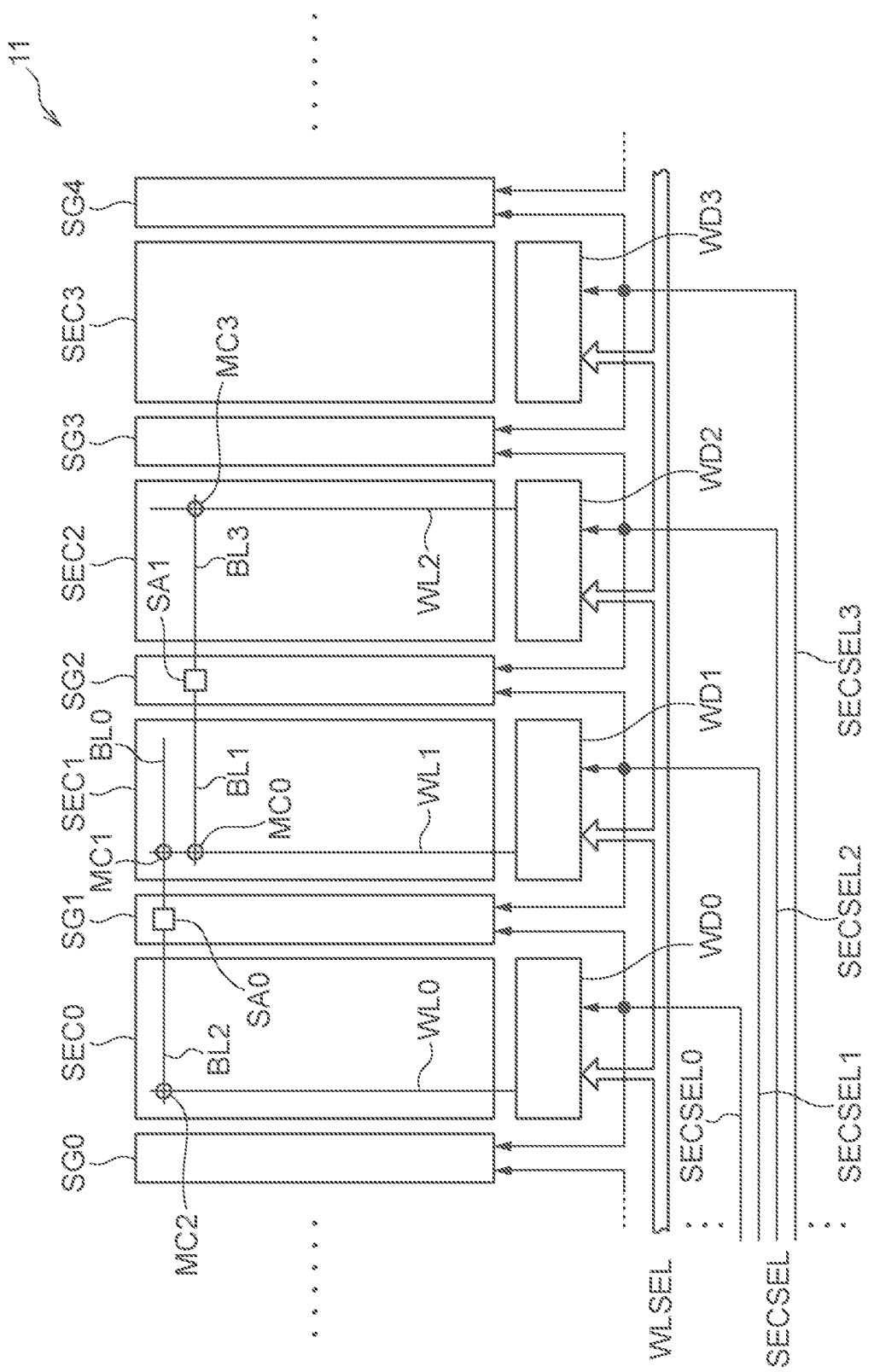
FIG. 4 is a block diagram showing a configuration of a main portion of a memory cell array according to an embodiment of the present disclosure.

FIG. 4 is a block diagram showing a configuration of a main portion of the memory cell array 11. As shown in FIG. 4, a plurality of memory sections SEC and a plurality of sense amplifier groups SG are alternately arranged in the memory cell array 11. FIG. 4 shows memory sections SEC0 to SEC3 and sense amplifier groups SG0 to SG4. Each memory section SEC has a plurality of word lines WL, a plurality of bit lines BL, and memory cells MC respectively arranged at intersections of those lines. FIG. 4 shows a word line WL1 and bit lines BL0 and BL1 included in the memory section SEC1, a word line WL0 and a bit line BL2 included in the memory section SEC0, and a word line WL2 and a bit line BL3 included in the memory section SEC2. The memory cell army 11 shown in FIG. 4 has a so-called open bit architecture, and bit lines BL of each pair respectively belong to memory sections SEC different firm each other. For example, the bit lines BL0 and BL2 forming a pair respectively belong to the memory sections SEC1 and SEC0 and are coupled to a sense amplifier SA0 included in the sense amplifier group SG1. The bit lines BL1 and BL3 forming a pair respectively belong to the memory sections SEC1 and SEC2 and are coupled to a sense amplifier SA1 included in the sense amplifier group SG2. To the memory sections SEC0 to SEC3, corresponding word drivers WD0 to WD3 are assigned, respectively. The word drivers WD0 to WD3 are each activated by a corresponding bit of the section selection signal SECSEL. For example, each of the word drivers WD0 to WD3 is exclusively activated by its corresponding one of bits SECSEL0 to SECSEL3 of the section selection signal SECSEL. The section selection signal SECSEL is also supplied to the sense amplifier groups SG. For example, when the bit SECSEL0 of the section selection signal SECSEL is activated, the two sense amplifier groups SG0 and SG corresponding to the memory section SEC0 are activated. When the bit SECSEL1 of the section selection signal SECSEL is activated, the two sense amplifier groups SG1 and SG2 corresponding to the memory section SEC1 are activated. When the bit SECSEL2 of the section selection signal SECSEL is activated, the two sense amplifier groups SG2 and SG3 corresponding to the memory section SEC2 are activated. When the bit SECSEL3 of the section selection signal SECSEL is activated, the two sense amplifier groups SG3 and SG4 corresponding to the memory section SEC3 are activated.

The word line selection signal WLSEL is supplied to the word drivers WD in common. Any one of the word drivers WD is exclusively activated based on the section selection signal SECSEL. Accordingly, the word line WL that is selected by the word line selection signal WLSEL in the memory section SEC that is selected by the section selection signal SECSEL is selected by the row address RA. Subsequently, when the word line WL1 belonging to the memory section SEC1 is selected, for example, in a normal operation, data pieces held by the memory cells MC0 and MC1 are read out to the bit lines BL1 and BL0, respectively. The potential of the bit line BL0 is compared with the potential of the bit line BL2 by the sense amplifier SA0 included in the sense amplifier group SG1 and a difference between them is amplified, so that read data is generated. Further, the potential of the bit line BL1 is compared with the potential of the bit line BL3 by the sense amplifier SA1 included in the sense amplifier group SG2 and a difference between them is amplified, so that read data is generated. The read data generated as described above is output to outside via the I/O circuit 13 shown in FIG. 1. Meanwhile, in a write operation, pieces of write data input from outside via the I/O circuit 13 are written to the memory cells MC0 and MC1 via the sense amplifiers SA1 and SA0, respectively. In the normal operation, after the above-described read/write operation is performed, a precharge operation is performed. When the precharge operation is performed, the word line WL1 returns to an unselected state and bit lines belonging to the memory section SEC1 and bit lines (for example, the bit line BL0 and the bit line BL2) each forming a pair together with any of the bit lines in the memory section SEC1 are equalized to have the same potential as each other.

A test of the word lines WL in a manufacturing stage is performed in accordance with the following procedure. First, in a case of testing the word lines WL included in the memory section SEC1, the same data (for example, a "0" level) is written to all the memory cells MC in the memory section SEC1 by a normal write operation. Further, "0" level data is written to all memory cells (for example, the memory cell MC2) that are selected by the word line WL0 in memory cells in the memory section SEC0, and is also written to all memory cells (for example, the memory cell MC3) that are selected by the word line WL2 in memory cells in the memory section SEC2. Thereafter, the word lines WL0 and WL2 are selected and all the sense amplifiers SA in the sense amplifier groups SG1 and SG2 are activated, thereby driving all the bit lines BL in the memory section SEC1 to a "1" level. In this state, the row address RA specifying the memory section SEC1 is input, and then the test signal TEST is activated to a high level. Thereafter, the value of the row address RA input from outside is sequentially updated, thereby sequentially selecting the word lines WL in the memory section SEC1 in a state where all the sense amplifiers SA in the sense amplifier groups SG1 and SG2 are kept active without performing a precharge operation. That is, unlike a normal operation, in a test operation, the precharge operation is not performed after a certain word line is made to return from a selected state to an unselected state and before another word line is selected.

Figure 5:
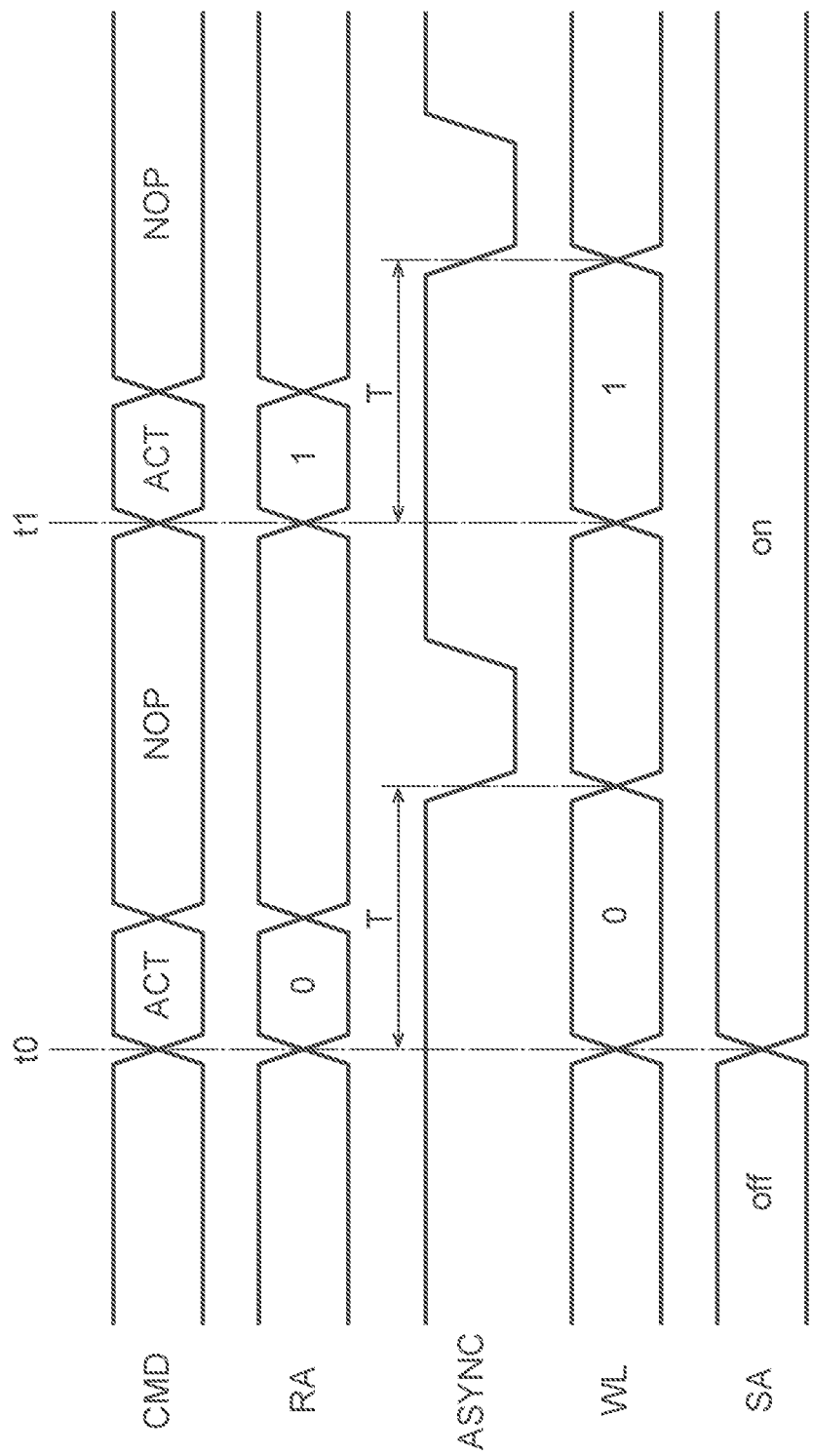
FIG. 5 is a timing chart for explaining a word line test operation according to an embodiment of the present disclosure.

FIG. 5 is a timing chart for explaining a word line test operation. In the example shown in FIG. 5, at times t0 and t1, an active command is issued and the row addresses RA different from each other are input. When the active command is issued, the word line WL corresponding to the specified row address RA is selected. In the test operation, it is possible to control the timing of deactivation of the word line WL by a control signal ASYNC input from outside. That is, with the timing of input of the control signal ASYNC, it is possible to adjust a period of time T during which the word line WL is in a selected state. When a certain word line WL in the memory section SEC1 is activated, "1" level data is written to the memory cells MC selected by this word line via the corresponding bit lines BL. However, in a case where there is a defect such as slow rising of that word line WL, data of the memory cells MC cannot be inverted in the period of time T and remains at a "0" level. Therefore, when the word lines WL in the memory section SEC1 are sequentially selected in a state where all the sense amplifiers SA in the sense amplifier groups SG1 and SG2 are kept active without performing a precharge operation, data is inverted to a "1" level for the memory cells MC corresponding to a normal word line WL and remains at a "0" level for the memory cells MC corresponding to a defective word line WL. Accordingly, it is possible to detect the defective word line WL by selecting all the word lines WL in the memory section SEC1 and then reading out data in the memory section SEC1 by a normal read operation.

As described above, when the value of the row address RA is updated in the word line test, the test signal TEST is activated to a high level. Therefore, even when a hazard occurs in the section address RSEC due to change of the value of the row address RA, the section selection signal SECSEL does not temporarily change. The reason why a hazard can occur in the section address RSEC due to change of the value of the row address RA is because the second address portion 32 included in the row address RA is involved in both generation of the section address RSEC and generation of the word line address RWL as described with reference to FIG. 2B. That is, even in a case where only the word line address RWL is changed while the section address RSEC is fixed, there is a possibility that a hazard occurs in the section address RSEC due to change of the second address portion 32. However, in the semiconductor device 10 according to the present embodiment, the section address RXSEC is fixed in the word line test operation, and therefore the section selection signal SECSEL does not temporarily change even when a hazard occurs in the section address RSEC. Accordingly, it is possible to correctly perform the word line test even in a case where the number of word lines included in each memory section SEC cannot be represented by a power-of-2. In addition, in a case of shifting to a test of the word lines WL included in another memory section, for example, the memory section SEC2, the test signal TEST is deactivated to a low level once, thereafter the row address RA specifying the memory section SEC2 is input, and the test signal TEST is activated to a high level again. Thereafter, the value of the row address RA input from outside is sequentially updated, thereby sequentially selecting the word lines WL in the memory section SEC2 without performing a precharge operation.

Although this disclosure has been disclosed in the context of certain preferred embodiments and examples, it will be understood by those skilled in the art that the disclosures extend beyond the specifically disclosed embodiments to other alternative embodiments and/or uses of the disclosures and obvious modifications and equivalents thereof. In addition, other modifications which are within the scope of this disclosure will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosure. Thus, it is intended that the scope of at least some of the present disclosure herein disclosed should not be limited by the particular disclosed embodiments described above.

The invention claimed is:

1. An apparatus comprising:
a plurality of memory sections each including a plurality of word lines;
a predecoder circuit configured to generate predecoded section address signals to select one of the plurality of memory sections based on a row address and predecoded word line address signals to select one of the word lines included in a selected one of the plurality of memory sections based on the row address; and
a section address control circuit configured to retain the predecoded section address signals regardless of an update of the row address in a test operation mode.

2. The apparatus of claim 1, further comprising:
a decoder circuit configured to generate a decoded section address signals responsive to the predecoded section address signals and decoded word line address signals responsive to the predecoded word line signals.

3. The apparatus of claim 2, further comprising a plurality of word drivers each provided to an associated one of the plurality of memory sections,
wherein each of the plurality of word drivers is configured to be selected responsive to a corresponding one of the decoded section address signals, and
wherein a selected one of the word drivers is configured to activate one of the word lines responsive to the decoded word line address signals.

4. The apparatus of claim 3, wherein the section address control circuit is configured to update the predecoded section address signals responsive to an update of the row address in a normal operation mode.

5. The apparatus of claim 4, wherein the section address control circuit is configured to transmit the predecoded section address signals as is from the predecoder circuit to the decoder circuit in the normal operation mode.

6. An apparatus comprising:
a plurality of memory sections each including a plurality of word lines;
a predecoder circuit configured to generate predecoded section address signals to select one of the plurality of memory sections and predecoded word line address signals to select one of the word lines included in a selected one of the plurality of memory sections based on a row address;
a section address control circuit configured to retain the predecoded section address signals regardless of an update of the row address in a test operation mode;
a decoder circuit configured to generate a decoded section address signals responsive to the predecoded section address signals and decoded word line address signals responsive to the predecoded word line signals; and
a plurality of word drivers each provided to an associated one of the plurality of memory sections,
wherein each of the plurality of word drivers is configured to be selected responsive to a corresponding one of the decoded section address signals,
wherein a selected one of the word drivers is configured to activate one of the word lines responsive to the decoded word line address signals,
wherein the section address control circuit is configured to update the predecoded section address signals responsive to an update of the row address in a normal operation mode,
wherein the section address control circuit is configured to transmit the predecoded section address signals as is from the predecoder circuit to the decoder circuit in the normal operation mode, and
wherein the section address control circuit is configured to latch the predecoded section address signals output from the predecoder circuit when a test signal is brought into an active state so that the predecoded section address signals supplied to the decoder circuit is fixed.

7. The apparatus of claim 6, further comprising a plurality of sense amplifier groups each including a plurality of sense amplifiers each configured to amplify a potential difference between an associated pair of a plurality of bit lines,
wherein at least one of the sense amplifier groups is configured to be activated based on the decoded section address signals.

8. The apparatus of claim 7,
wherein the bit lines included in each of the plurality of memory sections are grouped into a first group coupled to a predetermined one of the sense amplifier groups and a second group coupled to another predetermined one of the sense amplifier groups, and
wherein two of the sense amplifier groups are configured to be activated based on the decoded section address signals.

9. The apparatus of claim 7, wherein the selected one of the word drivers is configured to activate one of the word lines based on the decoded word line address signals in a state where the at least one of the sense amplifier groups is activated in the test operation mode.

10. The apparatus of claim 9, wherein the selected one of the word drivers is configured to deactivate the one of the word lines responsive to a control signal supplied from outside in the test operation mode.

11. An apparatus comprising:
a plurality of memory sections each including a plurality of word lines, wherein a number of word lines included in each of the plurality of memory sections is different from a power-of-two;
a predecoder circuit configured to generate predecoded section address signals to select one of the plurality of memory sections and predecoded word line address signals to select one of the word lines included in a selected one of the plurality of memory sections based on a row address; and
a section address control circuit configured to retain the predecoded section address signals regardless of an update of the row address in a test operation mode.

12. An apparatus comprising:
a plurality of memory sections each including a plurality of word lines;
a predecoder circuit configured to generate predecoded section address signals to select one of the plurality of memory sections and predecoded word line address signals to select one of the word lines included in a selected one of the plurality of memory sections based on a row address; and
a section address control circuit configured to retain the predecoded section address sig s regardless of an update of the row address in a test operation mode,
wherein the row address includes first, second, and third address parts, and
wherein the predecoder circuit is configured to generate the decoded section address signals based on the first and second address parts of the row address and generate the decoded word line address signals based on the second and third address parts of the row address.

* * * * *

UNITED STATES PATENT AND TRADEMARK OFFICE
CERTIFICATE OF CORRECTION

PATENT NO. : 11,605,419 B2  
APPLICATION NO. : 17/364829  
DATED : March 14, 2023  
INVENTOR(S) : Satoshi Morishita et al.

Page 1 of 1

It is certified that error appears in the above-identified patent and that said Letters Patent is hereby corrected as shown below:

In the Claims

| | Reads | Should Read |
|---|---|---|
| Column 8, Line 17 | "predecoded section address sigs" | -- predecoded section address signals -- |

Signed and Sealed this  
Second Day of January, 2024

Katherine Kelly Vidal  
*Director of the United States Patent and Trademark Office*